(12) United States Patent
Black et al.

(10) Patent No.: US 6,700,145 B1
(45) Date of Patent: Mar. 2, 2004

(54) CAPACITOR WITH HIGH CHARGE STORAGE CAPACITY

(75) Inventors: Charles T. Black, White Plains, NY (US); Jeffrey J. Welser, Stanford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/302,222

(22) Filed: Apr. 29, 1999

Related U.S. Application Data

(60) Provisional application No. 60/083,752, filed on Apr. 30, 1998.

(51) Int. Cl.[7] .................... H01L 29/76; H01L 29/94; H01L 31/062; H01L 31/113; H01L 31/119
(52) U.S. Cl. ............... 257/295; 257/296; 257/301; 257/303; 257/306; 257/310
(58) Field of Search ............... 257/295–310, 257/296

(56) References Cited

U.S. PATENT DOCUMENTS

| | | | | |
|---|---|---|---|---|
| 5,366,920 A | * | 11/1994 | Yamamichi et al. | 437/52 |
| 5,471,363 A | * | 11/1995 | Mihara | 361/305 |
| 5,519,234 A | * | 5/1996 | Paz de Araujo et al. | 257/295 |
| 5,530,279 A | * | 6/1996 | Yamamichi et al. | 257/310 |
| 5,796,648 A | * | 8/1998 | Kawakubo et al. | 365/145 |
| 5,838,035 A | * | 11/1998 | Ramesh | 257/295 |
| 5,854,107 A | * | 12/1998 | Park et al. | 438/254 |
| 5,955,774 A | * | 9/1999 | Kang | 257/533 |
| 5,986,301 A | * | 11/1999 | Fukushima et al. | 257/295 |
| 6,049,103 A | * | 4/2000 | Horikawa et al. | 257/296 |
| 6,052,271 A | * | 4/2000 | Nakamura | 361/103 |
| 6,060,735 A | * | 5/2000 | Izuha et al. | 257/295 |
| 6,091,099 A | * | 7/2000 | Kiyotoshi et al. | 257/310 |
| 6,151,240 A | * | 11/2000 | Suzuki | 365/145 |
| 6,198,119 B1 | * | 3/2001 | Mabatame et al. | 257/295 |
| 6,297,122 B1 | * | 10/2001 | Eguchi et al. | 438/396 |
| 2002/0153543 A1 | * | 10/2002 | Kijima | 257/296 |

OTHER PUBLICATIONS

Black, et al., "Electric–Field Penetration Into Metals: Consequences for High–Dielectric–Constant Capacitors", *IEEE Transactions on Electron Devices*, vol. 46., No. 4, (1998), pp. 776–870.

Izuha, et al., "Electrical Properties of All–Perovskite Oxide"; *Japanese Journal Applied Physics*, vol. 35 (1997), pp. 5866–5869, Part 1, No. 9B, Sep. 1997.

Fukushima, et al., "Epitaxial (Ba, Sr) TiO$_3$ Capacitors with Extremely High Dielectric Constant for DRAM Applications"; *IEEE*, (1997), pp. 257–260.

* cited by examiner

*Primary Examiner*—Jerome Jackson
*Assistant Examiner*—Jesse A. Fenty
(74) *Attorney, Agent, or Firm*—Wan Yee Cheung; Gary M. Hartman; Domenica N. S. Hartman

(57) ABSTRACT

A capacitor structure characterized by improved capacitance as a result of increasing the capacitance associated with charge spreading that occurs within the electrodes of the capacitor. The electrodes are formed of superconducting or high-dielectric constant conductor materials, and are preferably used in combination with high-dielectric constant insulator materials. The capacitor structures are particularly suited as thin-film capacitors of the type used for high-density applications such as DRAM.

11 Claims, 1 Drawing Sheet

CAPACITOR WITH HIGH CHARGE STORAGE CAPACITY

CROSS REFERENCE TO RELATED APPLICATIONS

This application claims the benefit of U.S. Provisional Application No. 60/083,752, filed Apr. 30, 1998.

BACKGROUND OF THE INVENTION

1. Field of the Invention

The present invention generally relates to electrical circuits and their components. More particularly, this invention relates to a thin-film capacitor characterized by a high charge storage capacity achieved by a combination of a high-dielectric constant insulator and either high-dielectric constant electrodes or superconducting electrodes.

2. Description of the Prior Art

Capacitors are typically formed to have a metal/insulator/metal structure (where "metal" here means any highly-conductive electrode material). The capacitance per unit area of a parallel-plate capacitor is well described by:

$$C = \epsilon_0 \epsilon_F / t$$

where $\epsilon_0$ is the permittivity of free-space (a physical constant), $\epsilon_F$ is the dielectric constant of the insulator, and t is the insulator thickness. Thin-film capacitors of the type used for high-density applications such as DRAM (dynamic random access memory) typically use thin (t≈5 nm) combinations of silicon dioxide (SiO$_2$) and silicon nitride (S$_3$N$_4$) as insulators, with an effective dielectric constant ($\epsilon_F$) of about 5, yielding a capacitance on the order of about 1.5 to 2 fF/$\mu$m$^2$. As memory densities increase, it becomes increasingly difficult to store adequate charge in ever-decreasing memory cell areas. As an example, for a one Gigabit (Gb) DRAM, the amount of planar area available for the capacitor in a memory cell may be on the order of only 0.05 $\mu$m$^2$. Consequently, to obtain capacitances on the order of 30 fF, it has become necessary to build highly-complicated, three-dimensional capacitors to increase the available interface surface area between the insulator and electrodes. The two main types are trench capacitors, which require deep, narrow holes in the substrate (typically silicon) on which the capacitors are formed, and stack capacitors which require tall, thin electrodes built above the substrate. Both types are becoming very difficult and expensive to build, due to the high aspect ratios involved.

In order to reduce the size of these capacitor structures, extremely high-capacity capacitors (on the order of 300 fF/$\mu$m$^2$ or more) would be advantageous. In the past, capacitance density has been primarily increased by reducing the insulator thickness t. However, as thickness is reduced, prohibitively large leakage currents can occur. Thus, intensive research has begun into the development of what has been termed "high-dielectric constant" insulators, such as barium strontium titanate (Ba$_x$Sr$_{1-x}$TiO$_3$; BST), which have dielectric constants on the order of 500 to 1000. From the equation above, the capacitance is proportional to the dielectric constant and inversely proportional to the insulator thickness. As a result, a BST capacitor ($\epsilon_F$=500 to 1000) would be expected to have at least 100 times the capacitance density of a silicon dioxide capacitor ($\epsilon_F$=about 5) of identical insulator thickness. However, experimentally it has been found that the effective dielectric constant of a BST capacitor drops precipitously as its thickness is decreased, greatly limiting the actual capacitance that is achievable.

While a portion of this decrease is undoubtedly due to variable quality of the BST thin film, a large portion is attributable to the interfaces between the insulator and metal electrodes. More specifically, a series capacitor is formed if there is any additional material layer (e.g., surface oxide or residual chemical scum) left at one or both of the insulator/electrode interfaces, or if the crystal structures of the insulator and electrodes are such that a transition layer or "dead" layer forms at one or both interfaces, i.e., if there is any layer between an electrode and the insulator which is neither fully-conducting like the electrode, nor has the high-dielectric constant of the insulator. Under such circumstances, the overall capacitance of the capacitor structure is:

$$1/C_{eff} = 1/C_{insulator} + 1/C_{interfaces}$$

Since the capacitances add reciprocally, the overall capacitance is reduced by the presence of an interface layer. Further, since the interface capacitance is often much smaller than a high-dielectric insulator such as BST, the reduction in capacitance can be quite large. As the insulator becomes thinner, C$_{insulator}$ approaches infinity, so the capacitance C$_{eff}$ is dominated by, and eventually will become equal to, the interface capacitance. Consequently, the effect of the interface layer is believed to explain the decrease in capacitance observed when capacitors with high-dielectric insulators are scaled for DRAM applications.

Several approaches have been tried to mediate this interface capacitance issue. One such approach has been to improve processing and cleaning steps to achieve a more abrupt, clean interface. In addition, it has been recognized that the choice of electrode metals can have a significant effect. In particular, platinum (Pt) is a popular choice because it is highly resistant to surface oxide formation. Another approach has been to use conductive oxides, such as iridium dioxide (IrO$_2$), as the electrode material, again preventing the formation of any barrier/nonconducting interface oxide. Finally, electrode materials with perovskite crystal structures ("perovskite materials"), which may have stoichiometry ABO$_3$ (where A is an element such as calcium, strontium or barium, and B is an element such as ruthenium or titanium), have been evaluated. These perovskite electrode materials have been used with high-dielectric perovskite insulator materials, such as BST, with the expectation that the interface between insulator and electrode materials of the same (perovskite) crystal structure might reduce interface capacitance.

Though the approaches described above have met some success, none have yet eliminated the detrimental effect attributed to the presence of an insulator/electrode interface layer. Accordingly, there is a need for further improvements in capacitances of thin-film capacitors, and particularly those having limited available planar surface area.

SUMMARY OF THE INVENTION

According to the present invention, there is provided a capacitor structure characterized by improved capacitance as a result of increasing the capacitance associated with charge spreading that occurs within the electrodes of the capacitor. Because this capacitance adds in series with the insulator capacitance, increasing the electrode capacitance is able to have a significant affect on the overall capacitance of the capacitor, particularly if the capacitor insulator is formed of a thin-film high-dielectric material.

Capacitors in accordance with this invention generally have an insulator between a pair of electrodes, with at least one of the electrodes being formed of a material that is either superconducting or has a high dielectric constant, preferably on the order of at least 10. To maximize the capacitance of the capacitor, the insulator is preferably formed of a high-dielectric constant material, preferably a dielectric constant of at least 20. Notably, improvements in capacitance can be achieved with this invention though the electrodes might have a crystal structure that is dissimilar to that of the insulator, including the situation where both the electrode and insulator materials have perovskite crystal structures but different lattice constants. In addition, either or both the electrodes and insulator may have a non-perovskite crystal structure. Accordingly, the present invention is contrary to the generally-accepted rationale behind the prior use of certain perovskite electrode materials with certain high-dielectric perovskite insulator materials, which was based on the belief that crystal lattice matching was required to reduce interface capacitance.

In view of the above, it can be seen that, while prior art attempts to increase the capacitance of thin-film capacitors, such as large memory DRAM with limited available planar surface area, have been directed toward reducing the extrinsic portion of the interface capacitance ($C_{interfaces}$), that is, parasitics due to imperfect fabrication, the present invention provides a capacitor structure that mediates an overlooked portion of $C_{interfaces}$, whose negative effect on capacitance has increased with the use of high-dielectric constant insulator materials such as BST. As a result, the present invention is directed to increasing the intrinsic capacitances of the electrodes themselves, as opposed to reducing the interface capacitance alone.

Other objects and advantages of this invention will be better appreciated from the following detailed description.

BRIEF DESCRIPTION OF THE DRAWINGS

The present invention will now be described, by way of example, with reference to the accompanying drawings, in which.

DETAILED DESCRIPTION OF THE PREFERRED EMBODIMENT

Figure 1:
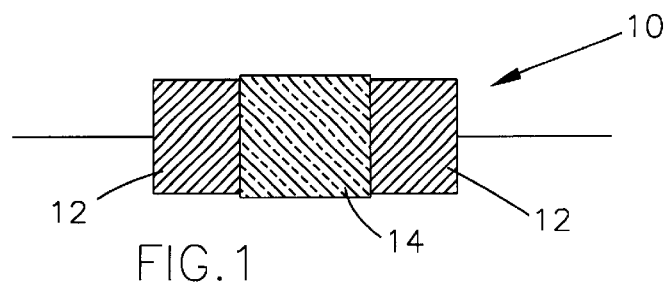
FIG. 1 is a schematic representation of an electrode-dielectric-electrode thin-film capacitor.
Figure 2:
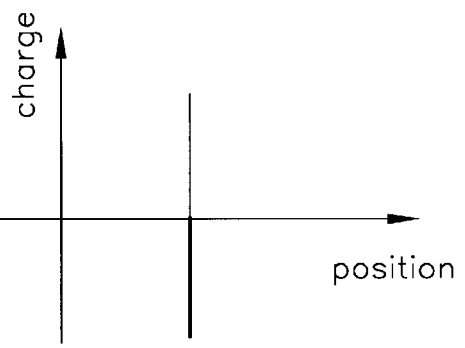
FIGS. 2 through 3 represent a conventional approximation and a more accurate model, respectively, of the displacement charge of the capacitor represented in FIG. 1.
Figure 3:
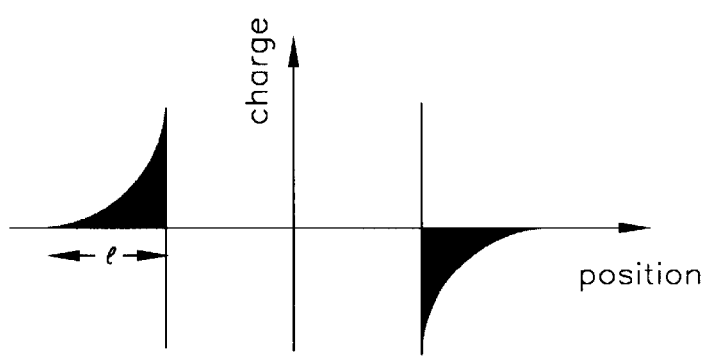

In an idealized model of a capacitor 10 shown in FIG. 1, it is assumed that the electrodes 12 are perfect conductors, so that the electron charge which is being stored on the capacitor 10 exists in an "infinitely-thin" plane directly at the surface of the electrodes 12 contacting the insulator 14, as schematically illustrated in FIG. 2. In reality, the charge in all typical metallic (and semiconductor) electrodes 12 will be very close to the electrode/insulator interface, but will spread some distance l into each electrode 12 as represented in FIG. 3. There is some capacitance associated with this charge spreading, and this capacitance will add in series with the insulator capacitance, as does the capacitance associated with the insulator/electrode interface, as previously discussed. Therefore, a more accurate model of the overall capacitance of the capacitor 10 is:

$$1/C_{eff} = 1/C_{insulator} + 1/C_{interfaces} + 1/C_{electrodes}$$

It is the recognition of this previously neglected charge-spreading effect that forms the basis of the present invention.

What follows is a description of a model for this capacitance that distinguishes the properties of electrode materials required to maximize the capacitance of capacitors, and particularly thin-film capacitors employing high-dielectric insulator materials such as BST. As a result, capacitors in accordance with this invention can be highly suitable for DRAM and other applications that require high-charge storage capacity within a limited planar surface area. However, no attempt is made to explain the exact physics of the improvements obtained with the present invention, as new insights into this phenomenon are likely to be discovered in the future.

The capacitance associated with the electrode 12, whose charge spreading is represented in FIG. 3, can be roughly modeled as $$C_{electrodes} = \in_0 (\in_m)^{1/2}/2 l_{TF}$$

where $\in_0$ is the permittivity of free-space (a physical constant), $\in_m$ is the static dielectric constant of the electrode material minus its conduction electrons, and $l_{TF} = l/(\in_m)^{1/2}$, where l is the distance from the electrode/insulator interface over which charge spreading occurs, and PTF is the Thomas-Fermi screening length. As understood by those skilled in the art, $l_{TF}$ is the electron screening length in an ideal electron gas with a uniform positive background charge, while l is the corresponding screening length in a real material where the underlying lattice of ionic cores is polarizable. The dielectric constant $\in_m$ can be associated with the electrode 12 for the reason that, though a metal is considered to have an infinite dielectric constant due to the high mobility of its conduction electrons, in the small space-charge region formed over the distance l from the electrode/insulator interface, the conduction electrons have already packed themselves as tightly as they can, and are therefore no longer free to move in response to an electric field. However, the remaining metallic lattice, composed of the atom cores and their valence electrons with a finite polarization response, can still be polarized just as in an insulator. Importantly, $C_{electrodes}$ is intrinsic to the electrode-insulator-electrode structure, and contributes to $C_{eff}$ regardless of improved processing techniques that may be employed to affect $C_{interfaces}$ as discussed above.

For typical metals, $\in_m$ is believed to be on the order of about 1 to 10, and $l_{TF}$ is believed to be on the order of about 0.05 nm. The $\in_m$ value for the electrodes 12 cannot be calculated for an arbitrary metal, though the dielectric response of bound electrons has been measured for copper and silver. Using copper as an example, $\in_m$ is about 5 and $l_{TF}$ is about 0.055 nm, yielding a $C_{electrode}$ value of about 180 fF/$\mu$m$^2$. For silver, $\in_m$ is about 2.5, yielding a $C_{electrode}$ value of about 130 fF/$\mu$m$^2$ based on $l_{TF}$=0.055 nm. Similar values would be expected for platinum and the other simple metals typically used in standard silicon technology.

In order to increase the capacitance of the electrodes 12 ($C_{electrodes}$) to the extent necessary to significantly affect the overall capacitance of the capacitor 10 ($C_{eff}$), $\in_m$ must be greatly increased, or $l_{TF}$ must be greatly decreased, or a combination of the two must occur. This is particularly true for capacitors with high-dielectric constant insulators, i.e., insulator materials having a $\in_m$ of at least 100, an example of which is BST. $l_{TF}$ is already quite small and does not vary greatly for electrodes materials typically used. For example, the value of $l_{TF}$ for conventional conductor materials such as copper, silver and their respective alloys is believed to be in the range of about 0.04 to about 0.08 nm, though it is foreseeable that the $l_{TF}$ value for some conductors could be outside this range. However, $l_{TF}$ can be significantly decreased by forming the electrodes 12 from a superconducting material, in which the density of electronic states near the Fermi energy becomes infinite. As a result, for a superconductor electrode, $l_{TF}$ is approximately zero—as in the ideal capacitor model of FIG. 2—and therefore $C_{electrodes}$ is effectively infinite. A limitation of this embodiment of the invention is that currently known superconducting materials are not superconducting at room temperature, but rather at temperatures of typically less than about 100 K. However, it is foreseeable that CMOS circuits will eventually be operated at temperatures below room temperature, making superconducting electrodes practical. Furthermore, as higher-temperature superconductors are developed, this embodiment of the invention becomes practical for standard DRAM applications.

Figure 4:
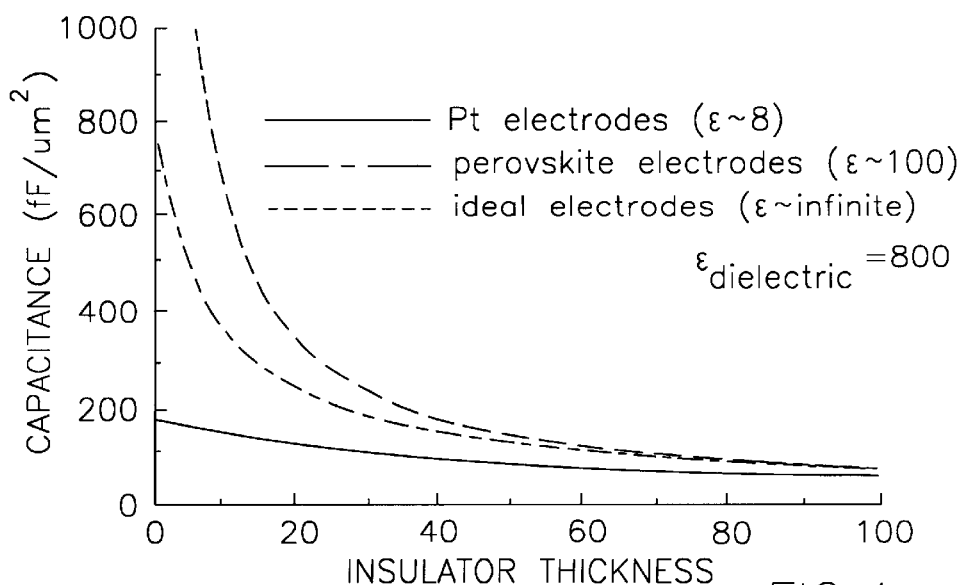
FIG. 4 is a graph comparing capacitance to insulator thickness for capacitors with different electrode materials.

Increasing $\in_m$ is believed to be more readily accomplished for the purpose of increasing the capacitance of the electrodes 12 ($C_{electrodes}$) to the extent necessary to significantly affect the overall capacitance of the capacitor 10 ($C_{eff}$). Conductive materials exist whose underlying lattices exhibit high $\in_m$, including the conductive perovskite materials $ABO_3$ mentioned above. The effect of a more highly-polarizable electrode lattice (larger $\in_m$) on the overall capacitance ($C_{eff}$) of the capacitor 10 is evident from FIG. 4, which compares the capacitance of electrodes formed of relatively low-dielectric constant ($\in$ of about 8) platinum, a high-dielectric constant ($\in$ of about 100) perovskite material, and an ideal (superconducting) electrode ($\in$ of infinity) in accordance with this invention. To have a significant effect on $C_{eff}$, electrode materials preferred for this invention have $\in_m$ values of at least 10.

Importantly, for purposes of the present invention, more highly-polarizable electrodes can be used with any high-dielectric ($\in_m \geq 20$) insulator, and are not limited to only perovskite electrodes (e.g., $SrRuO_3$) for crystal matching with perovskite insulators (e.g., BST) as required by the prior art. Accordingly, it is within the scope of this invention to use high-dielectric constant perovskite electrode materials such as $ABO_3$, in combination with non-perovskite insulator materials such as titania ($TiO_2$), fluorides (such as $BaF_2$, $MgF_2$, $CaF_2$, $BaMgF_4$, etc.), alumina ($Al_2O_3$), yttria ($Y_2O_3$), $LiNbO_3$, $LiTaO_3$, $Bi_4Ti_3O_{12}$, $SrBi_2Ti_2O_4$, compounds containing pyrochlore structures such as $Cd_2Nb_2O_7$, potassium dihydrogen phosphates, phosphates of rubidium, cesium or arsenic, and other like materials and combinations or multilayers thereof. In addition, non-perovskite electrode materials (e.g., materials other than $ABO_3$) having a high $\in_m$ are within the scope of this invention, and these materials can be used in combination with both perovskite and non-perovskite insulator materials. Examples of suitable high-dielectric non-perovskite electrode materials include noble metal oxides such as $PtO_x$, $IrO_x$, $PdO_x$, $RhO_x$, $OsO_x$, $AuO_x$, $AgO_x$ and $RuO_x$, conducting oxides such as $YBa_2Cu_3O_7$ (a layered perovskite), and mixtures and multilayers thereof. Examples of suitable perovskite electrode materials include titanate-based materials (e.g., BST), manganate-based materials, cuprate-based materials, tungsten bronze-type niobates, tantalates and titanates, bismuth layered-tantalates, niobates and titanates, and conducting oxides such as LaSr $CoO_3$. Preferred perovskite insulator materials are strontium bismuth tantalate, strontium bismuth niobate, bismuth titanate, strontium bismuth tantalate niobate, lead zirconate titanate, lead lanthanum zirconate titanate, and compositions of these materials modified by the incorporation of dopants.

While the invention has been described in terms of a preferred embodiment, it is apparent that other forms could be adopted by one skilled in the art. Accordingly, the scope of the invention is to be limited only by the following claims.

What is claimed is:

1. A capacitor comprising an insulator between a pair of electrodes, the electrodes being formed of high-dielectric conducting materials having a dielectric constant of at least 10, the high-dielectric conducting materials being chosen from the group consisting of:
   perovskite materials if the insulator is formed of a perovskite material on the condition that the perovskite materials of the electrodes has a different lattice constant than the perovskite material of the insulator; and
   perovskite materials if the insulator is formed of a non-perovskite material.

2. The capacitor set forth in claim 1, wherein the insulator is formed of a material having a dielectric constant of at least 20.

3. The capacitor set forth in claim 1, wherein the insulator and each of the electrodes are formed of a perovskite material, the perovskite material of the electrodes having a different lattice constant than the perovskite material of the insulator.

4. The capacitor set forth in claim 1, wherein each of the electrodes is formed of a perovskite material having a dielectric constant of at least 10 and the insulator is formed of a non-perovskite material having a dielectric constant of at least 20.

5. The capacitor set forth in claim 4, wherein the material of the electrodes is $ARuO_3$, where A is calcium, strontium or barium.

6. The capacitor set forth in claim 4, wherein the non-perovskite material of the insulator is chosen from the group consisting of titana, fluorides, alumina, yttria, $LiNbO_3$, $LiTaO_3$, $Bi_4Ti_3O_{12}$, $SrBi_2Ti_2O_4$, compounds containing pyrochlore structures, potassium dihydrogen phosphates, phosphates of rubidium, cesium and arsenic, and combinations and multilayers thereof.

7. The capacitor set forth in claim 1, wherein the capacitor is a DRAM.

8. A thin-film capacitor comprising an insulator between a pair of electrodes, the insulator being formed of a perovskite material having a dielectric constant of at least 20, the electrodes being formed of a perovskite material having a dielectric constant of at least 10, the perovskite material of the electrodes having a different lattice constant than the perovskite material of the insulator.

9. The thin-film capacitor set forth in claim 8, wherein the perovskite material of the electrodes is $ARuO_3$, where A is calcium, strontium or barium.

10. The thin-film capacitor set forth in claim 8, wherein the perovskite material of the insulator is chosen from the group consisting of titanate-based materials, manganate-based materials, cuprate-based materials, tungsten bronze-type niobates, tantalates and titanates, bismuth layered-tantalates, niobates and titanates, and $LaSrCoO_3$.

11. The thin-film capacitor set forth in claim 8, wherein the thin-film capacitor is a DRAM.

\* \* \* \* \*